(12) United States Patent
Philipp et al.

(10) Patent No.: US 7,545,668 B2
(45) Date of Patent: Jun. 9, 2009

(54) MUSHROOM PHASE CHANGE MEMORY HAVING A MULTILAYER ELECTRODE

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 46 days.

(21) Appl. No.: 11/766,831

(22) Filed: Jun. 22, 2007

(65) Prior Publication Data

US 2008/0316794 A1 Dec. 25, 2008

(51) Int. Cl.
*G11C 11/00* (2006.01)
(52) U.S. Cl. .................. 365/148; 365/163; 365/63; 365/227; 365/226; 257/4
(58) Field of Classification Search .............. 365/163, 365/148, 72, 63, 225.7, 227, 226; 257/4
See application file for complete search history.

(56) References Cited

U.S. PATENT DOCUMENTS

| 7,067,837 B2 | 6/2006 | Hwang et al. |
| 2005/0030800 A1 | 2/2005 | Johnson et al. |
| 2005/0227496 A1 | 10/2005 | Park et al. |
| 2006/0113573 A1 | 6/2006 | Cheong et al. |
| 2007/0025226 A1 | 2/2007 | Park et al. |
| 2008/0191187 A1* | 8/2008 | Lung et al. ............ 257/4 |
| 2008/0316794 A1* | 12/2008 | Philipp et al. .......... 365/148 |

OTHER PUBLICATIONS

"A 0.1um 1.8V .256Mb 66MHz Synchronous Burst PRAM", Sangbeom Kang, et al., IEEE International Solid-State Circuits Conference, 2006 (3 pgs.).
"Full Integration and Reliability Evaluation of Phase-Change RAM Based on .24um-CMOS Technologies", Y.N. Hwang, et al., Symposium on VLSI Technology Digest of Technical Papers, 2003 (2 pgs.).
"Highly Manufacturable High Density Phase Change Memory of 64Mb and Beyond", S.J. Ahn, et al., IEEE 2004 (4 pgs.).
"OUM—A 180 nm Nonvolatile Memory Cell Element Technology for Stand Alone and Embedded Applications", Stefan Lai, et al., Intel Corporation (4 pgs.).

* cited by examiner

*Primary Examiner*—Andrew Q Tran
(74) *Attorney, Agent, or Firm*—Dicke, Billig & Czaja, PLLC

(57) ABSTRACT

An integrated circuit includes a first electrode including at least two electrode material layers and a resistivity changing material including a first portion and a second portion. The first portion contacts the first electrode and has a same cross-sectional width as the first electrode. The second portion has a greater cross-sectional width than the first portion. The integrated circuit includes a second electrode coupled to the resistivity changing material.

14 Claims, 16 Drawing Sheets

MUSHROOM PHASE CHANGE MEMORY HAVING A MULTILAYER ELECTRODE

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

One type of phase change memory cell is a mushroom phase change memory cell in which a heater electrode is used to program a small portion of the phase change material of the memory cell. To reduce the power used by an array of memory cells, the reset current used to program a phase change memory cell to an amorphous state should be reduced.

For these and other reasons, there is a need for the present invention.

SUMMARY

One embodiment provides an integrated circuit. The integrated circuit includes a first electrode including at least two electrode material layers and a resistivity changing material including a first portion and a second portion. The first portion contacts the first electrode and has a same cross-sectional width as the first electrode. The second portion has a greater cross-sectional width than the first portion. The integrated circuit includes a second electrode coupled to the resistivity changing material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
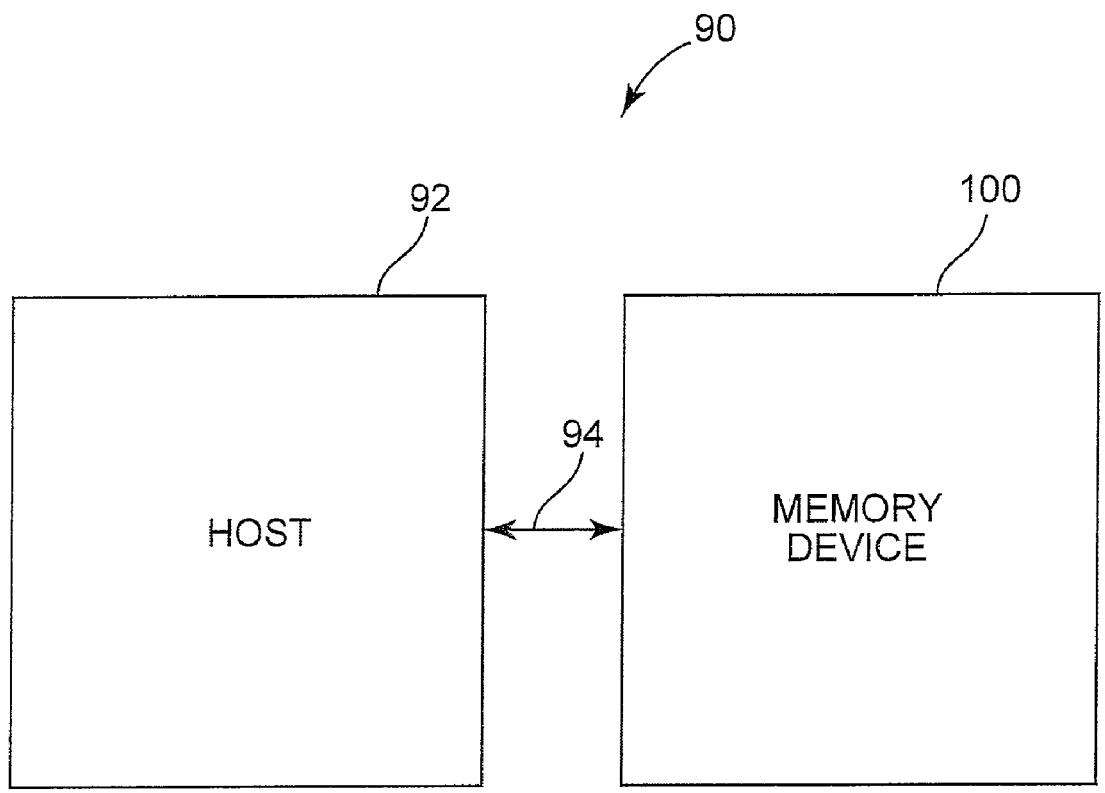
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing material memory device.

Figure 2:
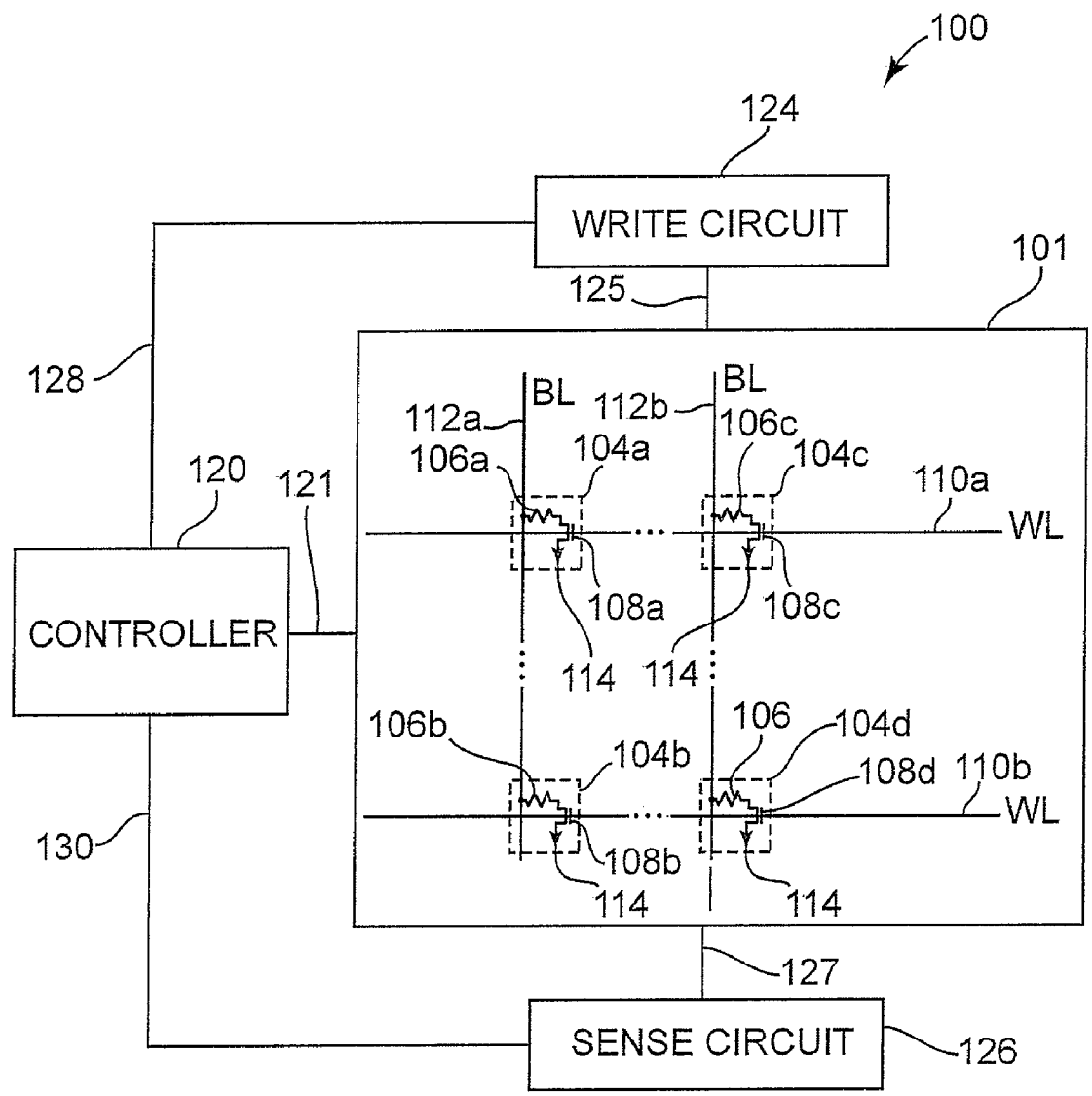
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 101, and a sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Each phase change memory cell 104 includes a recessed mushroom phase change memory cell. The recessed mushroom phase change memory cell includes a multilayer bottom electrode. During fabrication, a suitable number of layers of the multilayer bottom electrode are selectively etched to digitally control the depth of a recess in which phase change material is deposited. By controlling the depth of the recess, the reset current for the memory cell is controlled.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104, and sense circuit 126 reads the current that flows through that one of the memory cells 104. In another embodiment, write circuit 124 provides current that flows through one of the memory cells 104, and sense circuit 126 reads the voltage across that one of the memory cells 104.

During a set operation of phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101 are set and reset similarly to phase change memory cell 104a using a similar current or voltage pulse.

Figure 3A:
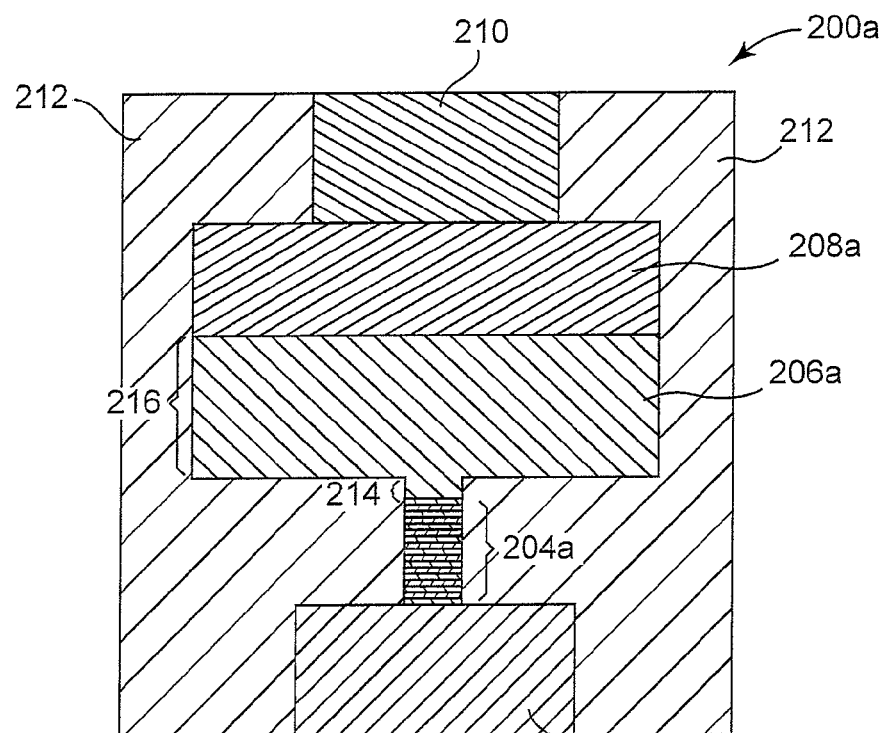
FIG. 3A illustrates a cross-sectional view of one embodiment of a phase change element.

FIG. 3A illustrates a cross-sectional view of one embodiment of a phase change element 200a. In one embodiment, each phase change element 106 is similar to phase change element 200a. Phase change element 200a includes a bottom contact 202, a bottom electrode 204a, a phase change material storage location 206a, a top electrode 208a, a top contact 210, and dielectric material 212. Phase change material storage location 206a includes a first portion 214 and a second portion 216. In one embodiment, phase change material storage location 206a is a mushroom phase change material storage location.

In one embodiment, second portion 216 of phase change material storage location 206a has the same cross-sectional width as top electrode 208a. First portion 214 of phase change material storage location 206a is recessed. First portion 214 of phase change material storage location 206a has the same cross-sectional width as bottom electrode 204a. Bottom electrode 204a includes multiple electrode material layers, which alternate between at least two different electrode materials. Bottom electrode 204a includes any suitable number of electrode material layers.

Bottom contact 202 includes TiN, TaN, W, Al, Ti, Ta, TiSiN, TaSiN, TiAlN, TaAlN, Cu, WN, C, or other suitable contact material. The top of bottom contact 202 contacts the bottom of bottom electrode 204a. The multiple electrode material layers of bottom electrode 204a alternate between a first electrode material and a second electrode material different from the first electrode material. The first electrode material includes TiN, TaN, W, Al, Ti, Ta, TiSiN, TaSiN, TiAlN, TaAlN, Cu, WN, C, or other suitable electrode material. The second electrode material includes TiN, TaN, W, Al, Ti, Ta, TiSiN, TaSiN, TiAlN, TaAlN, Cu, WN, C, Si, Ge, a phase change material, or other suitable electrically conductive material.

The top of bottom electrode 204a contacts the bottom of first portion 214 of phase change material storage location 206a. Phase change material storage location 206a provides a storage location for storing one or more bits of data. The active or phase change region in phase change material storage location 206a is at the interface between first portion 214 of phase change material storage location 206a and bottom electrode 204a.

The top of second portion 216 of phase change material storage location 206a contacts the bottom of top electrode 208a. Top electrode 208a includes TiN, TaN, W, Al, Ti, Ta, TiSiN, TaSiN, TiAlN, Cu, WN, C, or other suitable electrode material. The top of top electrode 208a contacts the bottom of top contact 210. Top contact 210 includes TiN, TaN, W, Al, Ti, Ta, TiSiN, TaSiN, TiAlN, Cu, WN, C, or other suitable contact material. Top contact 210, top electrode 208a, phase change material storage location 206a, bottom electrode 204a, and bottom contact 202 are laterally surrounded by dielectric material 212. Dielectric material 212 includes $SiO_2$, $SiO_x$, SiN, fluorinated silica glass (FSG), boro-phosphorous silicate glass (BPSG), boro-silicate glass (BSG), or other suitable dielectric material.

The current path through memory element 200a is from top contact 210 through top electrode 208a, phase change material storage location 206a, and bottom electrode 204a to bottom contact 202. In another embodiment, the current path is reversed. Recessed first portion 214 of phase change material storage location 206a reduces the reset current for programming phase change element 200a. In addition, multilayer bottom electrode 204a has reduced thermal conductivity to bottom contact 202 due to the interface thermal resistance. Multilayer bottom electrode 204a and recessed first portion 214 of phase change material storage location 206a reduce the heat loss from phase change material storage location 206a during programming, thus reducing the power used to program phase change element 200a.

During operation, current or voltage pulses are applied between top contact 210 and bottom contact 202 to program phase change element 200a. During a set operation of phase change element 200a, a set current or voltage pulse is selectively enabled by write circuit 124 and sent through a bit line to top contact 210. From top contact 210, the set current or voltage pulse passes through top electrode 208a and phase change material storage location 206a thereby heating the phase change material above its crystallization temperature (but usually below its melting temperature). In this way, the phase change material reaches a crystalline state or a partially crystalline and partially amorphous state during the set operation.

During a reset operation of phase change element 200a, a reset current or voltage pulse is selectively enabled by write circuit 124 and sent through a bit line to top contact 210. From top contact 210, the reset current or voltage pulse passes through top electrode 208a and phase change material storage location 206a. The reset current or voltage quickly heats the phase change material above its melting temperature. After the current or voltage pulse is turned off, the phase change material quickly quench cools into an amorphous state or a partially amorphous and partially crystalline state.

Figure 3B:
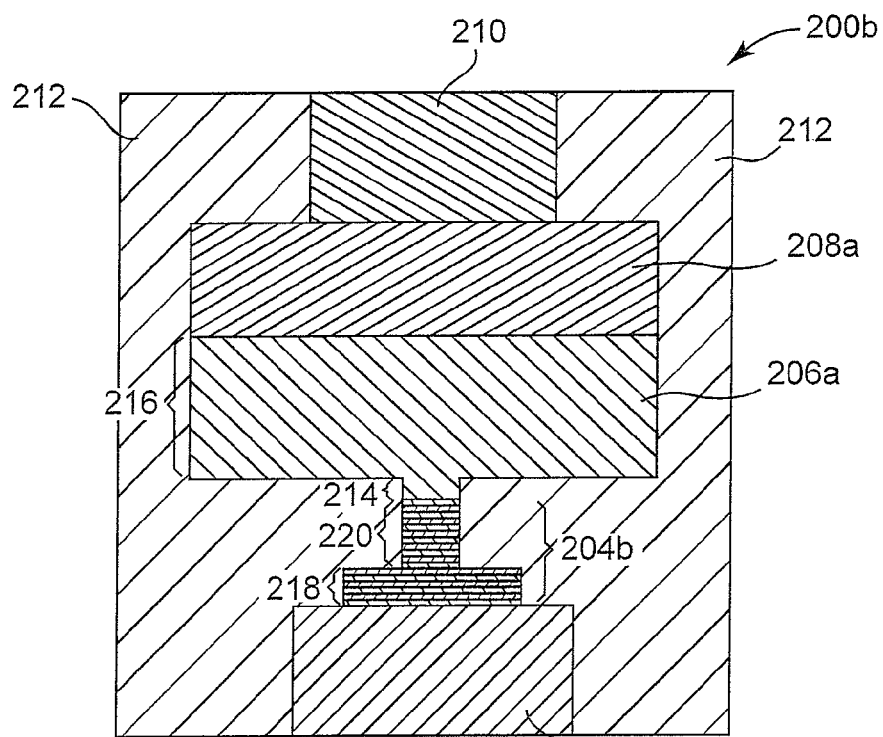
FIG. 3B illustrates a cross-sectional view of another embodiment of a phase change element.

FIG. 3B illustrates a cross-sectional view of another embodiment of a phase change element 200b. Phase change element 200b is similar to phase change element 200a previously described and illustrated with reference to FIG. 3A, except that for phase change element 200b bottom electrode 204a is replaced with bottom electrode 204b. In this embodiment, bottom electrode 204b includes a first portion 218 and a second portion 220. Both first portion 218 and second portion 220 include multiple electrode material layers. First portion 218 has a larger cross-sectional width than second portion 220. Bottom contact 202 contacts the bottom of first portion 218 of bottom electrode 204b. In one embodiment, each phase change element 106 is similar to phase change element 200b. Phase change element 200b operates similarly to phase change element 200a previously described and illustrated with reference to FIG. 3A.

Figure 4A:
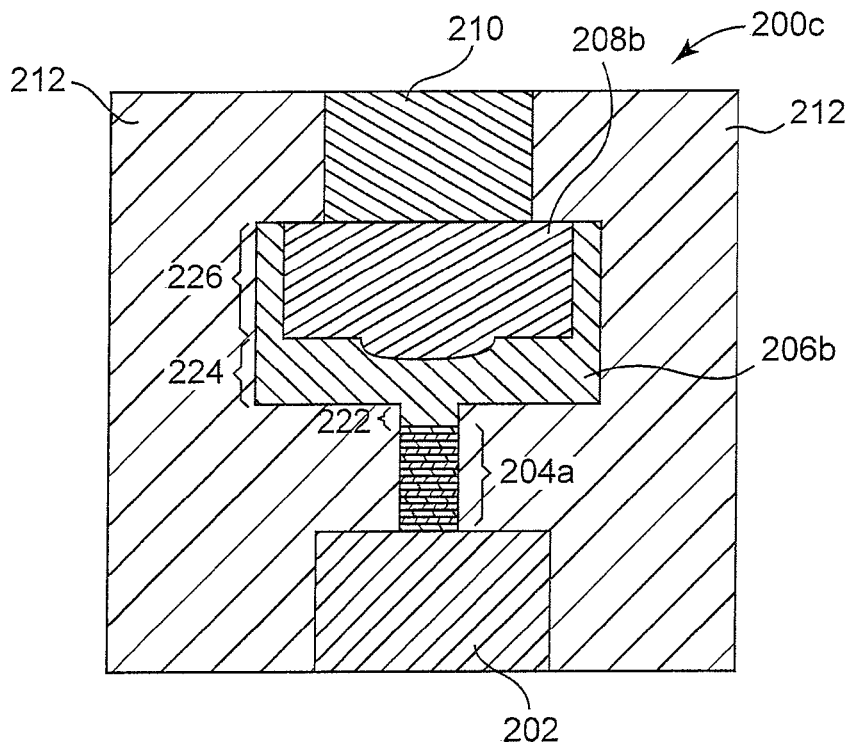
FIG. 4A illustrates a cross-sectional view of another embodiment of a phase change element.

FIG. 4A illustrates a cross-sectional view of another embodiment of a phase change element 200c. Phase change element 200c is similar to phase change element 200a previously described and illustrated with reference to FIG. 3A, except that for phase change element 200c phase change material storage location 206a and top electrode 208a are replaced with phase change material storage location 206b and top electrode 208b. In this embodiment, phase change material storage location 206b includes a first portion 222, a second portion 224, and a third portion 226. First portion 222 is recessed and contacts the top of bottom electrode 204a. Second portion 224 has a larger cross-sectional width than first portion 222. The top of second portion 224 contacts the bottom of top electrode 208b. Third portion 226 laterally surrounds top electrode 208b. In one embodiment, each phase change element 106 is similar to phase change element 200c. Phase change element 200c operates similarly to phase change element 200a previously described and illustrated with reference to FIG. 3A.

Figure 4B:
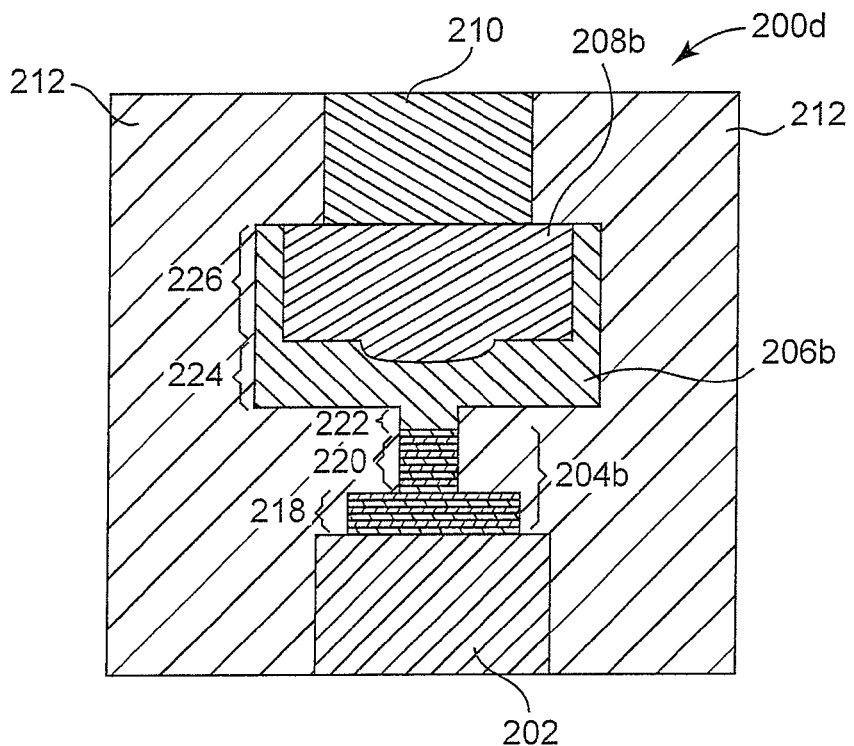
FIG. 4B illustrates a cross-sectional view of another embodiment of a phase change element.

FIG. 4B illustrates a cross-sectional view of another embodiment of a phase change element 200d. Phase change element 200d is similar to phase change element 200c previously described and illustrated with reference to FIG. 4A, except that for phase change element 200d bottom electrode 204a is replaced with bottom electrode 204b as previously described and illustrated with reference to FIG. 3B. In one embodiment, each phase change element 106 is similar to phase change element 200d. Phase change element 200d operates similarly to phase change element 200a previously described and illustrated with reference to FIG. 3A.

The following FIGS. 5-26 illustrate embodiments for fabricating a phase change element, such as phase change element 200a-200d previously described and illustrated with reference to FIGS. 3A-4B.

Figure 5:
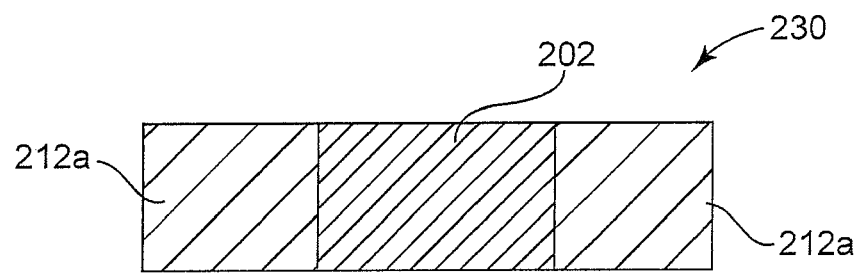
FIG. 5 illustrates a cross-sectional view of one embodiment of a preprocessed wafer.

FIG. 5 illustrates a cross-sectional view of one embodiment of a preprocessed wafer 230. Preprocessed wafer 230 includes bottom contact 202, dielectric material 212a, and lower wafer layers (not shown). In one embodiment, the lower wafer layers include access devices, such as transistors or diodes, where each transistor or diode is coupled to a bottom contact 202. Bottom contact 202 includes TiN, TaN, W, Al, Ti, Ta, TiSiN, TaSiN, TiAlN, TaAlN, Cu, WN, C, or other suitable contact material. Bottom contact 202 is laterally surrounded by dielectric material 212a. Dielectric material 212a includes $SiO_2$, $SiO_x$, SiN, FSG, BPSG, BSG, or other suitable dielectric material.

Figure 6:
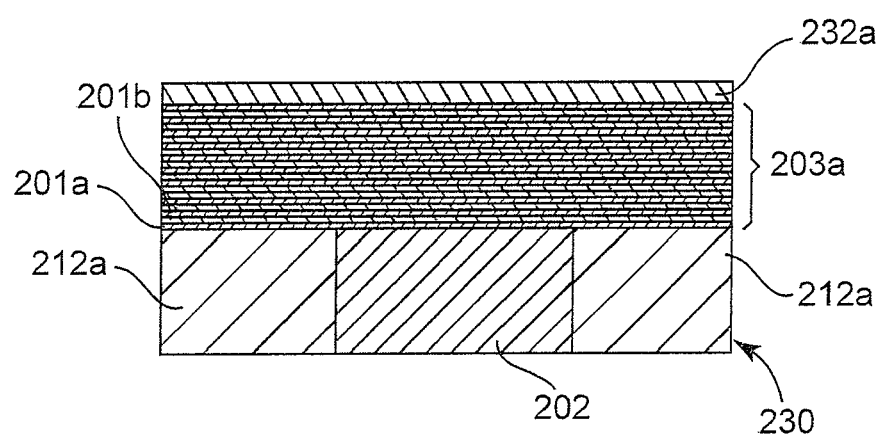
FIG. 6 illustrates a cross-sectional view of one embodiment of the preprocessed wafer, multiple electrode material layers, and a planarization stop material layer.

FIG. 6 illustrates a cross-sectional view of one embodiment of preprocessed wafer 230, multiple electrode material layers 203a, and an optional planarization stop material layer 232a. An electrode material, such as TiN, TaN, W, Al, Ti, Ta, TiSiN, TaSiN, TiAlN, TaAlN, Cu, WN, C, Si, Ge, a phase change material, or other suitable electrode material is deposited over preprocessed wafer 230 to provide electrode material layer 201a. Electrode material layer 201a is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique.

An electrode material, different from electrode material layer 201a, such as TiN, TaN, W, Al, Ti, Ta, TiSiN, TaSiN, TiAlN, TaAlN, Cu, WN, C, Si, Ge, a phase change material, or other suitable electrode material is deposited over electrode material layer 201a to provide electrode material layer 201b. Electrode material layer 201b is deposited using CVD, HDP-CVD, ALD, MOCVD, PVD, JVD, or other suitable deposition technique.

The same electrode material as electrode material layer 201a or another suitable electrode material, such as TiN, TaN, W, Al, Ti, Ta, TiSiN, TaSiN, TiAlN, TaAlN, Cu, WN, C, Si, Ge, or a phase change material is deposited over electrode material layer 201b to provide another electrode material layer of multiple electrode material layers 203a. The electrode material layer is deposited using CVD, HDP-CVD, ALD, MOCVD, PVD, JVD, or other suitable deposition technique. Any suitable number of additional electrode material layers are then deposited to provide multiple electrode material layers 203a such that the top layer includes TiN, TaN, W, Al, Ti, Ta, TiSiN, TaSiN, TiAlN, TaAlN, Cu, WN, C, or other suitable electrode material.

An optional planarization stop material, such as SiN or other suitable planarization stop material is deposited over electrode material layers 203a to provide planarization stop material layer 232a. Planarization stop material layer 232a is deposited using CVD, HDP-CVD, ALD, MOCVD, PVD, JVD, or other suitable deposition technique. In another embodiment, planarization stop material layer 232a is excluded.

Figure 7:
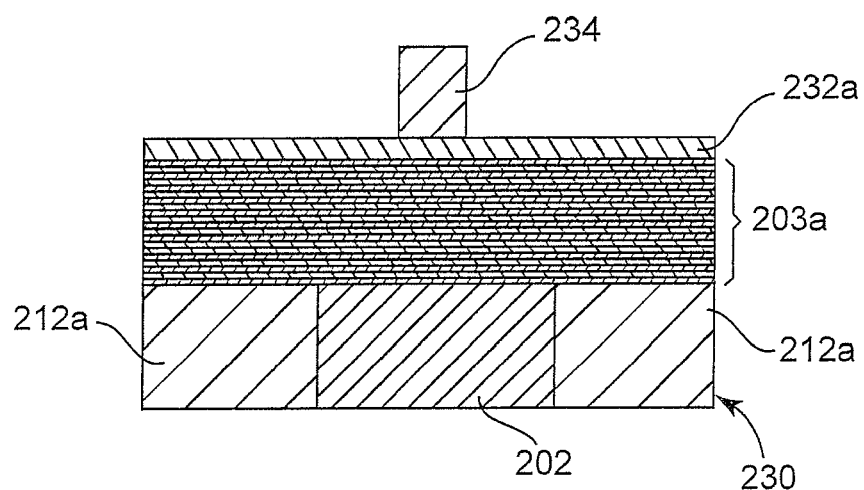
FIG. 7 illustrates a cross-sectional view of one embodiment of the preprocessed wafer, the multiple electrode material layers, the planarization stop material layer, and a mask.

FIG. 7 illustrates a cross-sectional view of one embodiment of preprocessed wafer 230, multiple electrode material layers 203a, planarization stop material layer 232a, and a mask 234. A mask material or materials, such as photo resist, a hard mask material and photo resist, or other suitable mask material or materials are deposited over planarization stop material layer 232a to provide a mask material layer. The mask material layer is deposited using CVD, HDP-CVD, ALD, MOCVD, PVD, JVD, spin on, or other suitable deposition technique. Using lithography, the mask material layer is patterned and etched to provide a pillar of mask material forming mask 234.

In one embodiment, where the mask material layer includes photo resist, the photo resist is trimmed after the lithography process to reduce the cross-sectional width of the mask material to a sublithographic width. In one embodiment, where a hard mask material and photo resist is used, the photo resist is stripped after forming the pillar of mask material. In another embodiment, where the mask material layer includes a hard mask, the hard mask material is trimmed using a wet etch or other suitable etch after the lithography process to reduce the cross-sectional width of the pillar of mask material to a sublithographic width. In another embodiment, where the mask layer includes a hard mask material and photo resist, a photo resist trim and etching of the hard mask material is performed after the lithography process to reduce the cross-sectional width of the pillar of mask material to a sublithographic width.

Figure 8:
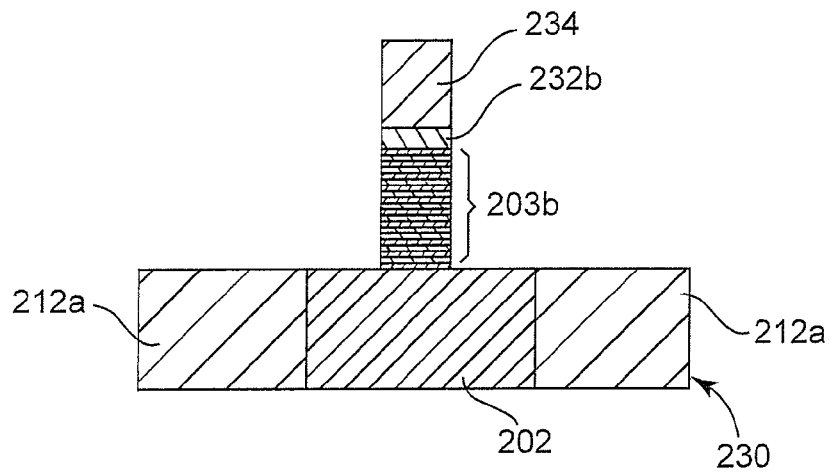
FIG. 8 illustrates a cross-sectional view of one embodiment of the preprocessed wafer, the multiple electrode material layers, the planarization stop material layer, and the mask after etching the planarization stop material layer and the multiple electrode material layers.

FIG. 8 illustrates a cross-sectional view of one embodiment of preprocessed wafer 230, multiple electrode material layers 203b, planarization stop material layer 232b, and mask 234 after etching planarization stop material layer 232a and multiple electrode material layers 203a. Exposed portions of planarization stop material layer 232a and multiple electrode material layers 203a are etched to expose portions of preprocessed wafer 230 and to provide a pillar of multiple electrode material layers 203b and planarization stop material layer 232b. In one embodiment, planarization stop material layer 232b and multiple electrode material layers 203b are substantially centered over bottom contact 202.

Figure 9:
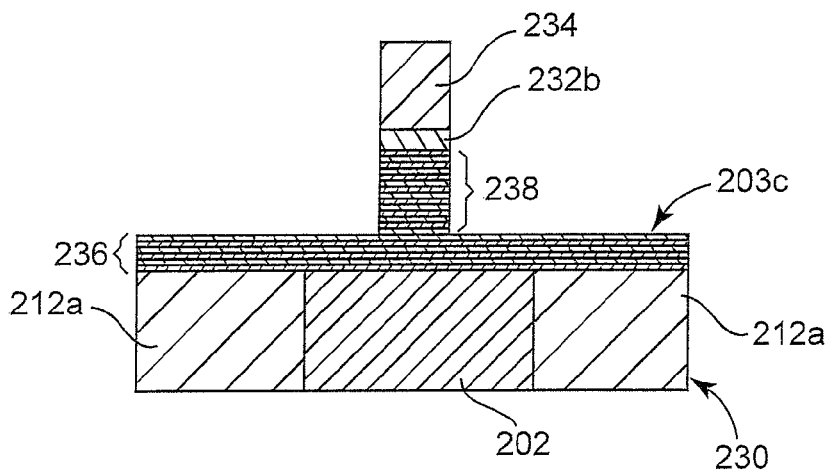
FIG. 9 illustrates a cross-sectional view of another embodiment of the preprocessed wafer, the multiple electrode material layers, the planarization stop material layer, and the mask after etching the planarization stop material layer and the multiple electrode material layers.

FIG. 9 illustrates a cross-sectional view of another embodiment of preprocessed wafer 230, multiple electrode material layers 203c, planarization stop material layer 232b, and mask 234 after etching planarization stop material layer 232a and multiple electrode material layers 203a. Exposed portions of planarization stop material layer 232a and multiple electrode material layers 203a illustrated in FIG. 7 are etched to provide multiple electrode material layers 203c and planarization stop material layer 232b. Multiple electrode material layers 203c include a first portion 236 and a second portion 238. First portion 236 includes multiple electrode material layers that have not been etched. Second portion 238 includes multiple electrode material layers that have been etched self-aligned to mask 234 to provide a pillar. First portion 236 and second portion 238 each include any suitable number of electrode material layers. In one embodiment, planarization stop material layer 232b and second portion 238 of multiple electrode material layers 203c are substantially centered over bottom contact 202.

Figure 10:
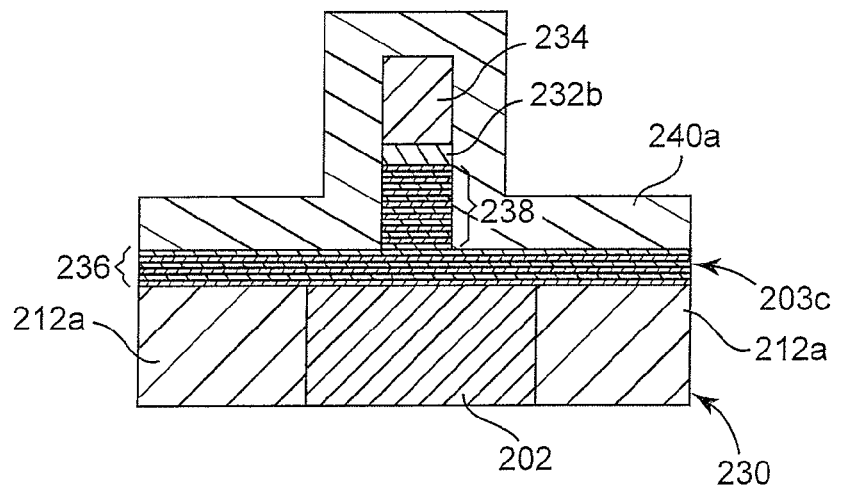
FIG. 10 illustrates a cross-sectional view of one embodiment of the preprocessed wafer, the multiple electrode material layers, the planarization stop material layer, the mask, and a spacer material layer.

FIG. 10 illustrates a cross-sectional view of one embodiment of preprocessed wafer 230, multiple electrode material layers 203c, planarization stop material layer 232b, mask 234, and a spacer material layer 240a. A spacer material, such as $SiO_2$, $SiO_x$, SiN, or other suitable spacer material is conformally deposited over exposed portions of mask 234, planarization stop material layer 232b, and multiple electrode material layers 203c to provide spacer material layer 240a. Spacer material layer 240a is deposited using CVD, HDP-CVD, ALD, MOCVD, PVD, JVD, or other suitable deposition technique.

Figure 11:
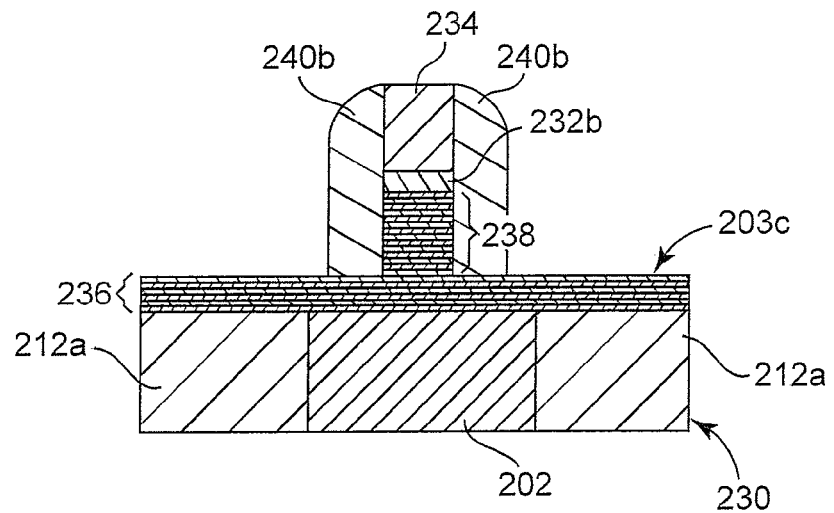
FIG. 11 illustrates a cross-sectional view of one embodiment of the preprocessed wafer, the multiple electrode material layers, the planarization stop material layer, the mask, and spacers after etching the spacer material layer.

FIG. 11 illustrates a cross-sectional view of one embodiment of preprocessed wafer 230, multiple electrode material layers 203c, planarization stop material layer 232b, mask 234, and spacers 240b after etching spacer material layer 240a. Spacer material layer 240a is spacer etched to expose mask 234 and portions of first portion 236 of multiple electrode material layers 203c and to provide spacers 240b.

Figure 12:
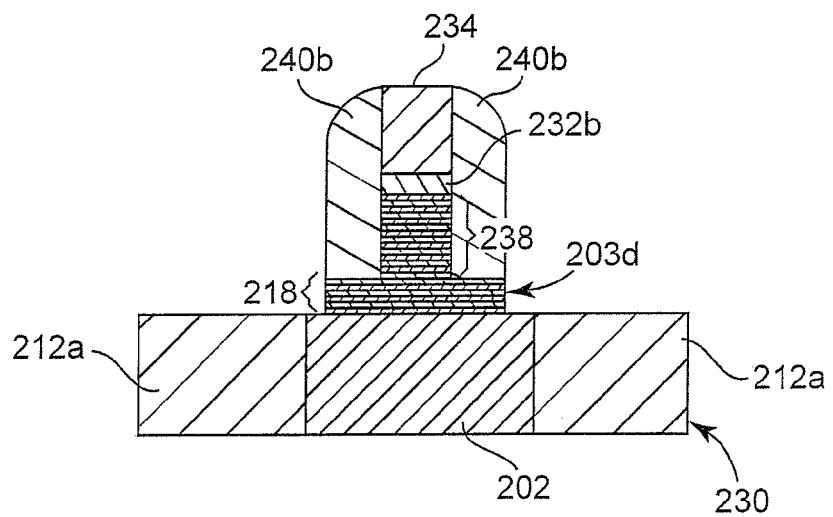
FIG. 12 illustrates a cross-sectional view of one embodiment of the preprocessed wafer, the multiple electrode material layers, the planarization stop material layer, the mask, and spacers after etching the multiple electrode material layers.

FIG. 12 illustrates a cross-sectional view of one embodiment of preprocessed wafer 230, multiple electrode material layers 203d, planarization stop material layer 232b, mask 234, and spacers 240b after etching multiple electrode material layers 203c. Exposed portions of first portion 236 of multiple electrode material layers 203c are etched self-aligned to spacers 240b to expose portions of preprocessed wafer 230 and to provide multiple electrode material layers 203d. While the following FIGS. 13-26 illustrate embodiments using multiple electrode material layers 203b previously described and illustrated with reference to FIG. 8, in other embodiments multiple electrode material layers 203d can be used in place of multiple electrode material layers 203b.

Figure 13:
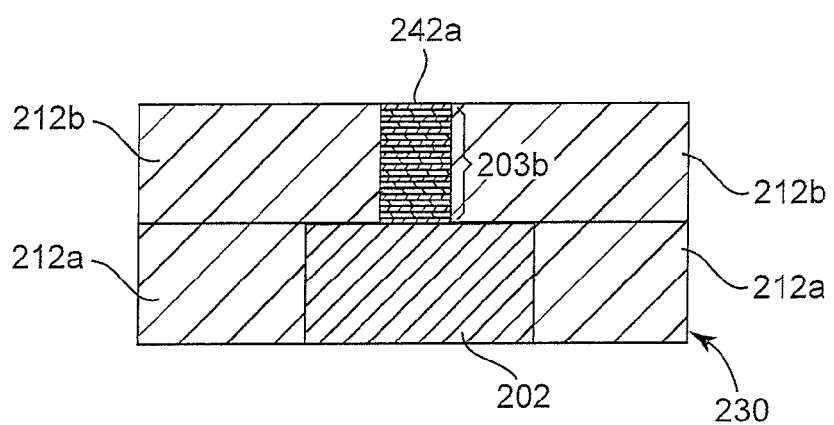
FIG. 13 illustrates a cross-sectional view of one embodiment of the preprocessed wafer, the multiple electrode material layers, and a first dielectric material layer.

FIG. 13 illustrates a cross-sectional view of one embodiment of preprocessed wafer 230, multiple electrode material layers 203b, and a first dielectric material layer 212b. A dielectric material, such as $SiO_2$, $SiO_x$, SiN, FSG, BPSG, BSG, or other suitable dielectric material is deposited over exposed portions of preprocessed wafer 230, mask 234, planarization stop material layer 232b, and multiple electrode material layers 203b illustrated in FIG. 8 to provide a first dielectric material layer. The first dielectric material layer is deposited using CVD, HDP-CVD, ALD, MOCVD, PVD, JVD, or other suitable deposition technique. The first dielectric material layer is planarized to expose the top (first) electrode material layer 242a of multiple electrode material layers 203b. In one embodiment, the planarization stops on planarization stop material layer 232b and planarization stop material layer 232b is then removed. The first dielectric material layer is planarized using chemical mechanical planarization (CMP) or another suitable planarization technique to provide first dielectric material layer 212b.

Figure 14A:
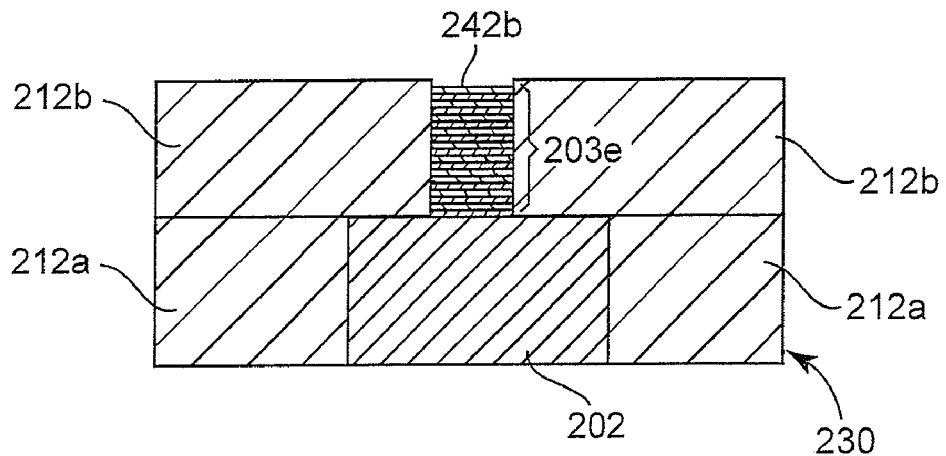
FIG. 14A illustrates a cross-sectional view of one embodiment of the preprocessed wafer, the multiple electrode material layers, and the first dielectric material layer after etching a first electrode material layer.

FIG. 14A illustrates a cross-sectional view of one embodiment of preprocessed wafer 230, multiple electrode material layers 203e, and first dielectric material layer 212b after etching first electrode material layer 242a. A selective etch is used to remove first electrode material layer 242a of multiple electrode material layers 203b to expose a second electrode material layer 242b of multiple electrode material layers 203e.

Figure 14B:
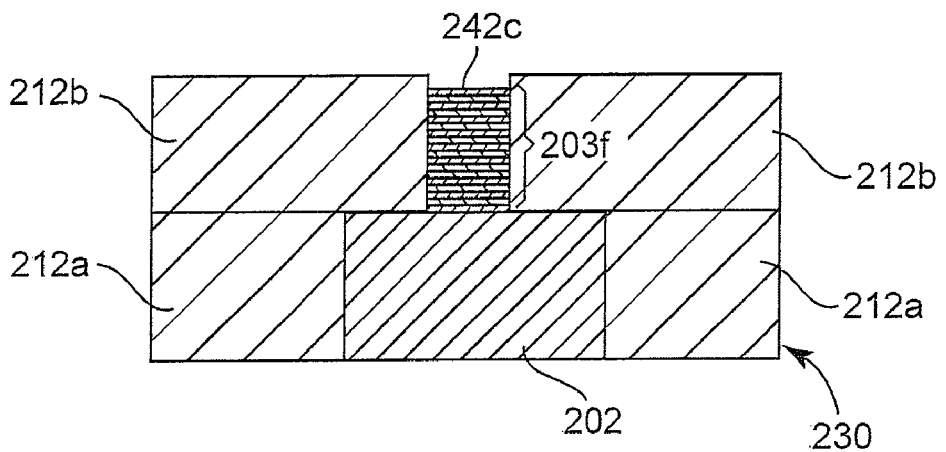
FIG. 14B illustrates a cross-sectional view of one embodiment of the preprocessed wafer, the multiple electrode material layers, and the first dielectric material layer after etching a second electrode material layer.

FIG. 14B illustrates a cross-sectional view of one embodiment of preprocessed wafer 230, multiple electrode material layers 203f, and first dielectric material layer 212b after etching second electrode material layer 242b. A selective etch is used to remove second electrode material layer 242b of multiple electrode material layers 203e to expose a third electrode material layer 242c of multiple electrode material layers 203f.

Figure 14C:
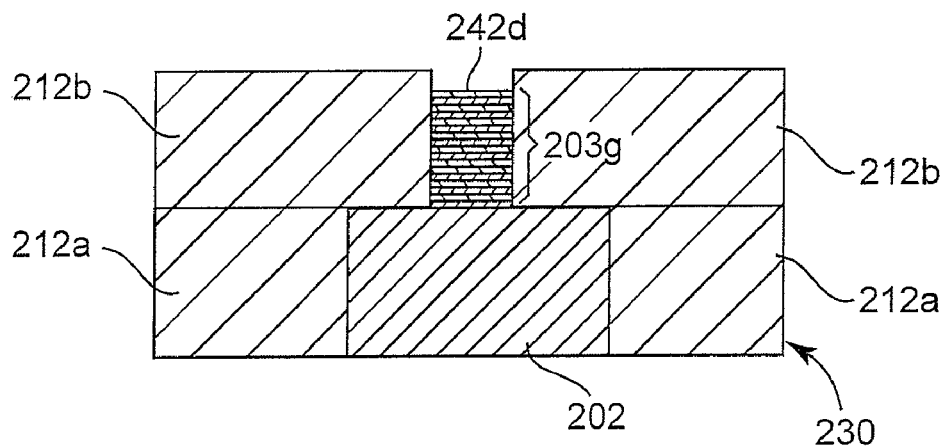
FIG. 14C illustrates a cross-sectional view of one embodiment of the preprocessed wafer, the multiple electrode material layers, and the first dielectric material layer after etching a third electrode material layer.

FIG. 14C illustrates a cross-sectional view of one embodiment of preprocessed wafer 230, multiple electrode material layers 203g, and first dielectric material layer 212b after etching third electrode material layer 242c. A selective etch is used to remove third electrode material layer 242c of multiple electrode material layers 203f to expose a fourth electrode material layer 242d of multiple electrode material layers 203g.

Figure 14D:
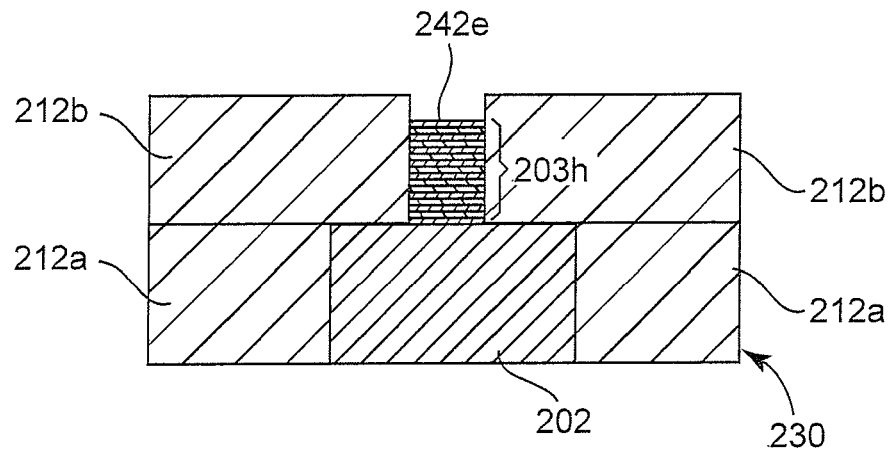
FIG. 14D illustrates a cross-sectional view of one embodiment of the preprocessed wafer, the multiple electrode material layers, and the first dielectric material layer after etching a fourth electrode material layer.

FIG. 14D illustrates a cross-sectional view of one embodiment of preprocessed wafer 230, multiple electrode material layers 203h, and first dielectric material layer 212b after etching fourth electrode material layer 242d. A selective etch is used to remove fourth electrode material layer 242d of multiple electrode material layers 203g to expose a fifth electrode material layer 242e of multiple electrode material layers 203h.

Figure 14E:
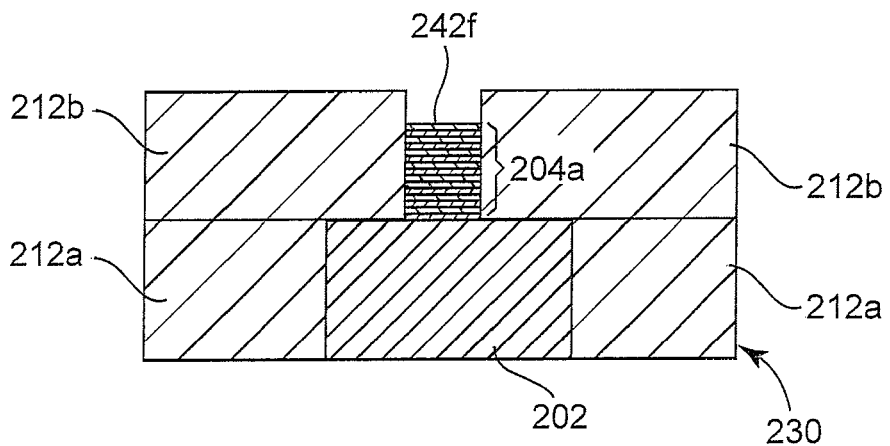
FIG. 14E illustrates a cross-sectional view of one embodiment of the preprocessed wafer, a bottom electrode, and the first dielectric material layer after etching a fifth electrode material layer.

FIG. 14E illustrates a cross-sectional view of one embodiment of preprocessed wafer 230, a bottom electrode 204a, and first dielectric material layer 212b after etching fifth electrode material layer 242e. A selective etch is used to remove fifth electrode material layer 242e of multiple electrode material layers 203h to expose a sixth electrode material layer 242f and to provide bottom electrode 204a. In other embodiments, any suitable number of electrode material layers are selectively etched to provide an opening within first dielectric material layer 212b having a selected depth.

Figure 15:
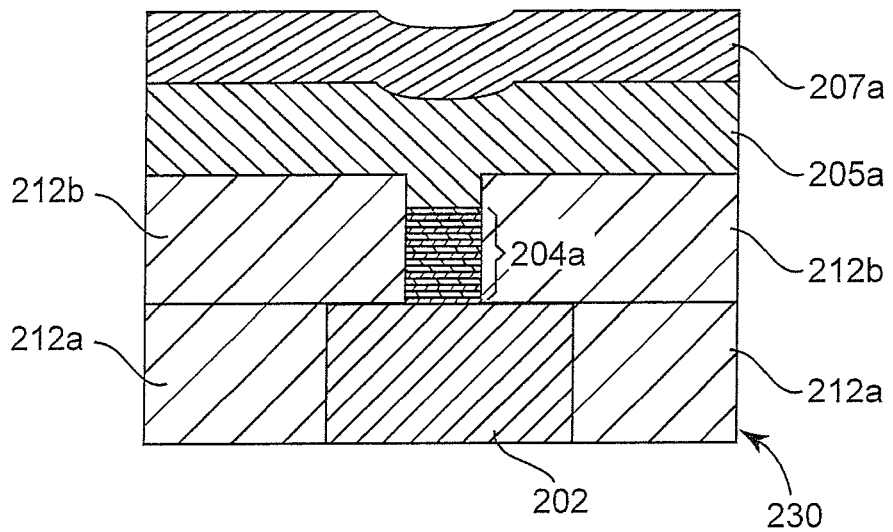
FIG. 15 illustrates a cross-sectional view of one embodiment of the preprocessed wafer, the bottom electrode, the first dielectric material layer, a phase change material layer, and an electrode material layer.

FIG. 15 illustrates a cross-sectional view of one embodiment of preprocessed wafer 230, bottom electrode 204a, first dielectric material layer 212b, a phase change material layer 205a, and an electrode material layer 207a. A phase change material, such as a chalcogenide compound material or other suitable phase change material is deposited over first dielectric material layer 212b and bottom electrode 204a to provide phase change material layer 205a. Phase change material layer 205a is deposited using CVD, HDP-CVD, ALD, MOCVD, PVD, JVD, spin on, or other suitable deposition technique.

An electrode material, such as TiN, TaN, W, Al, Ti, Ta, TiSiN, TaSiN, TiAlN, TaAlN, Cu, WN, C, or other suitable electrode material is deposited over phase change material layer 205a to provide electrode material layer 207a. Electrode material layer 207a is deposited using CVD, HDP-CVD, ALD, MOCVD, PVD, JVD, or other suitable deposition technique.

Figure 16:
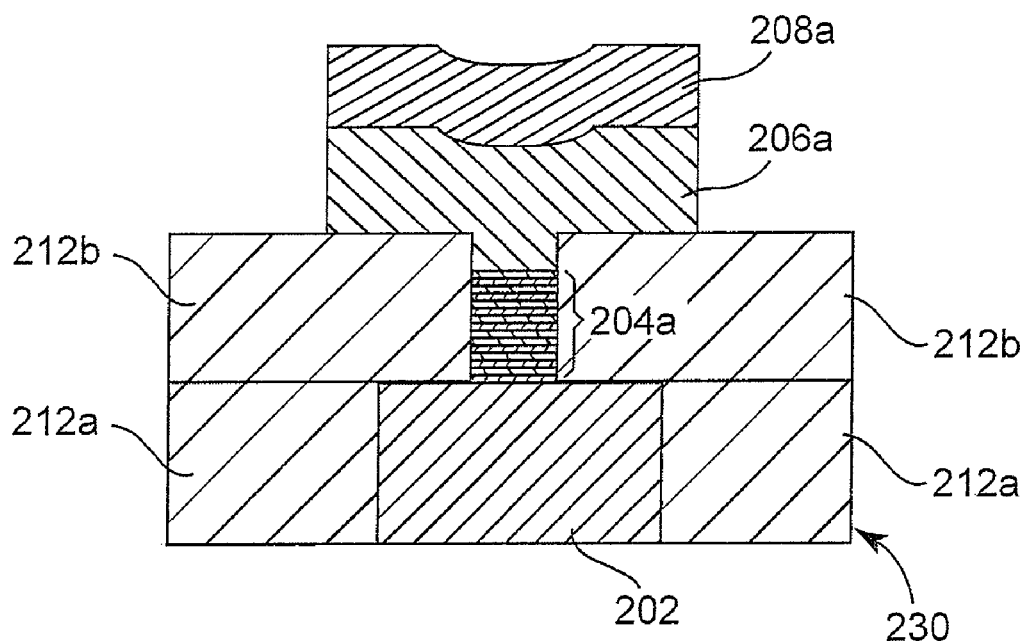
FIG. 16 illustrates a cross-sectional view of one embodiment of the preprocessed wafer, the bottom electrode, the first dielectric material layer, a phase change material storage location, and a top electrode after etching the electrode material layer and the phase change material layer.

FIG. 16 illustrates a cross-sectional view of one embodiment of preprocessed wafer 230, bottom electrode 204a, first dielectric material layer 212b, a phase change material storage location 206a, and a top electrode 208a after etching electrode material layer 207a and phase change material layer 205a. Electrode material layer 207a and phase change material layer 205a are etched to expose portions of first dielectric material layer 212b and to provide phase change material storage location 206a and top electrode 208a. In one embodiment, top electrode 208a and phase change material storage location 206a are substantially centered over bottom electrode 204a.

In another embodiment, where multiple electrode material layers 203c illustrated in FIG. 9 are used, first portion 236 of multiple electrode material layers 203c is not etched as previously described and illustrated with reference to FIGS.

10-12. In this embodiment, first portion 236 is etched with electrode material layer 207a and phase change material layer 205a to provide top electrode 208a, phase change material storage location 206a, and bottom electrode 204b.

A dielectric material, such as SiO$_2$, SiO$_x$, SiN, FSG, BPSG, BSG, or other suitable dielectric material is deposited over exposed portions of top electrode 208a, phase change material storage location 206a, and first dielectric material layer 212b to provide a second dielectric material layer. The second dielectric material layer is deposited using CVD, HDP-CVD, ALD, MOCVD, PVD, JVD, or other suitable deposition technique. The second dielectric material layer is then planarized to expose top electrode 208a. The second dielectric material layer is planarized using CMP or another suitable planarization technique. Top contact 210 is then formed over top electrode 208a using additional deposition and etching processes to provide phase change element 200a or 200b as previously described and illustrated with reference to FIGS. 3A and 3B.

The following FIGS. 17-26 illustrate embodiments for fabricating phase change elements 200c and 200d as previously described and illustrated with reference to FIGS. 4A and 4B.

Figure 17:
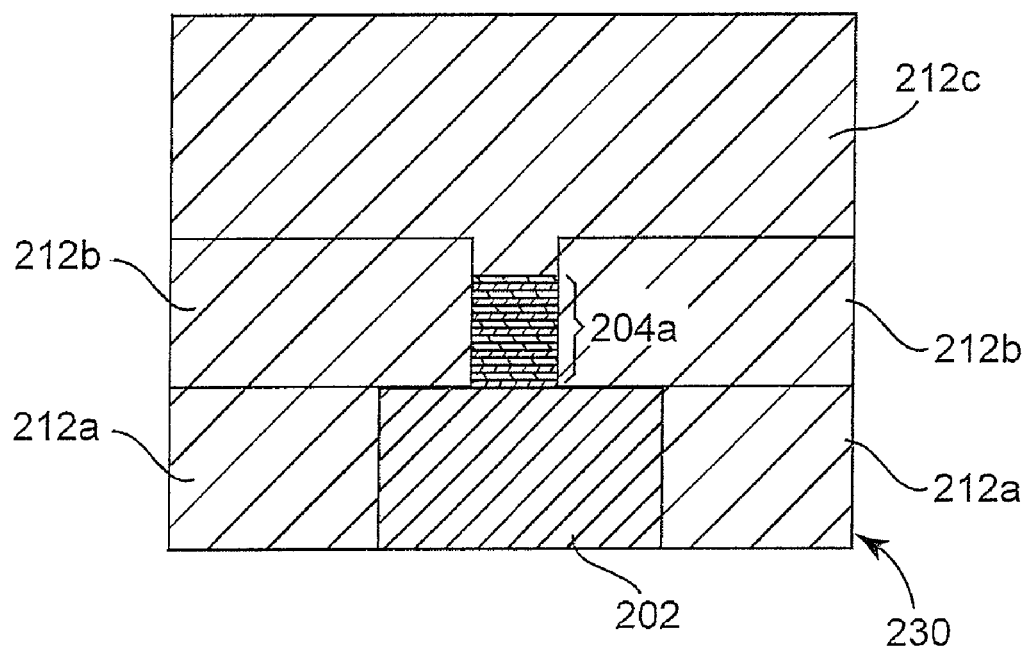
FIG. 17 illustrates a cross-sectional view of one embodiment of the preprocessed wafer, the bottom electrode, the first dielectric material layer, and a second dielectric material layer.

FIG. 17 illustrates a cross-sectional view of one embodiment of preprocessed wafer 230, bottom electrode 204a, first dielectric material layer 212b, and a second dielectric material layer 212c. A dielectric material different than first dielectric material layer 212b, such as SiO$_2$, SiO$_x$, SiN, FSG, BPSG, BSG, or other suitable dielectric material is deposited over first dielectric material layer 212b and bottom electrode 204a illustrated in FIG. 14E to provide a second dielectric material layer. The second dielectric material layer is deposited using CVD, HDP-CVD, ALD, MOCVD, PVD, JVD, or other suitable deposition technique. The second dielectric material layer is then planarized to provide second dielectric material layer 212c. The second dielectric material layer is planarized using CMP or another suitable planarization technique.

Figure 18:
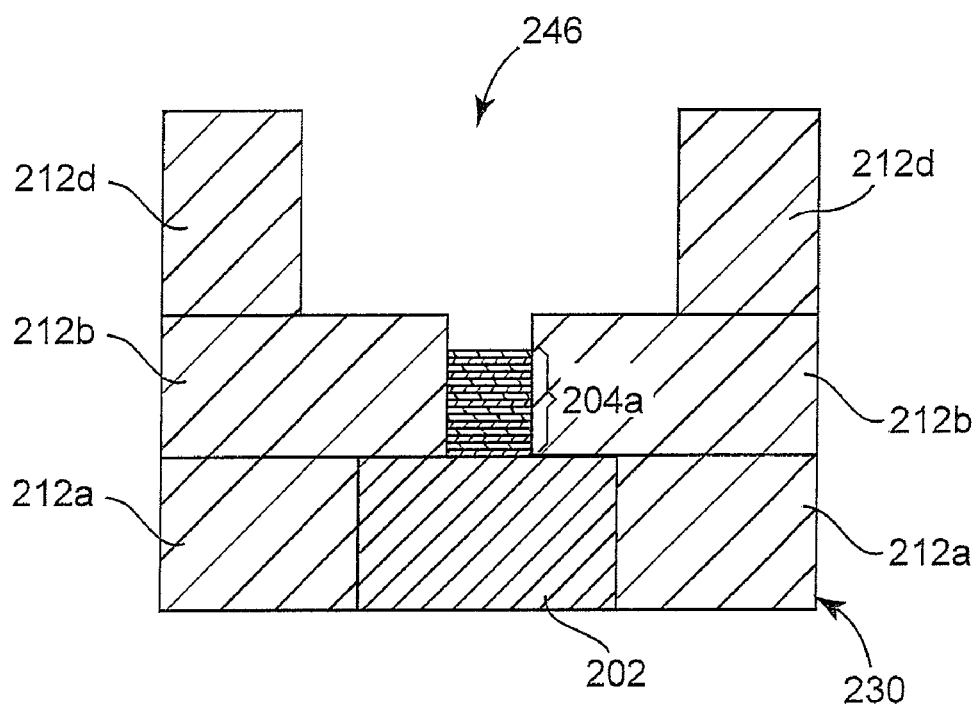
FIG. 18 illustrates a cross-sectional view of one embodiment of the preprocessed wafer, the bottom electrode, the first dielectric material layer, and the second dielectric material layer after etching the second dielectric material layer.

FIG. 18 illustrates a cross-sectional view of one embodiment of preprocessed wafer 230, bottom electrode 204a, first dielectric material layer 212b, and second dielectric material layer 212d after etching second dielectric material layer 212c. Second dielectric material layer 212c is selectively etched to provide opening 246 exposing bottom electrode 204a and portions of first dielectric material layer 212b. In one embodiment, opening 246 is cylindrical in shape and exposes a single bottom electrode 204a. In another embodiment, opening 246 is a trench and exposes two or more bottom electrodes 204a in a row or column of memory array 101. In one embodiment, opening 246 is substantially centered over bottom electrode 204a.

Figure 19:
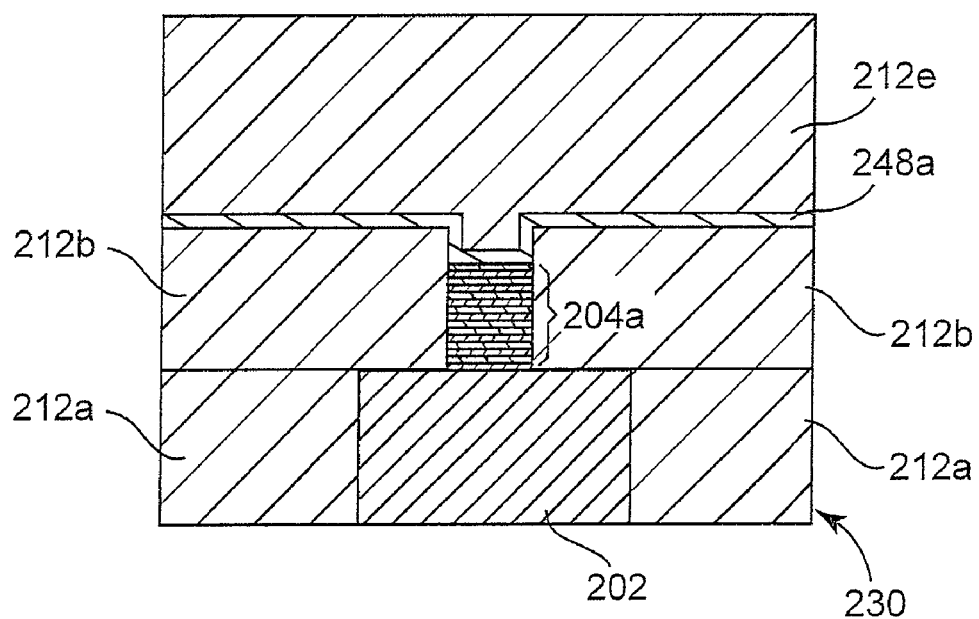
FIG. 19 illustrates a cross-sectional view of one embodiment of the preprocessed wafer, the bottom electrode, the first dielectric material layer, an etch stop material layer, and a second dielectric material layer.
Figure 20:
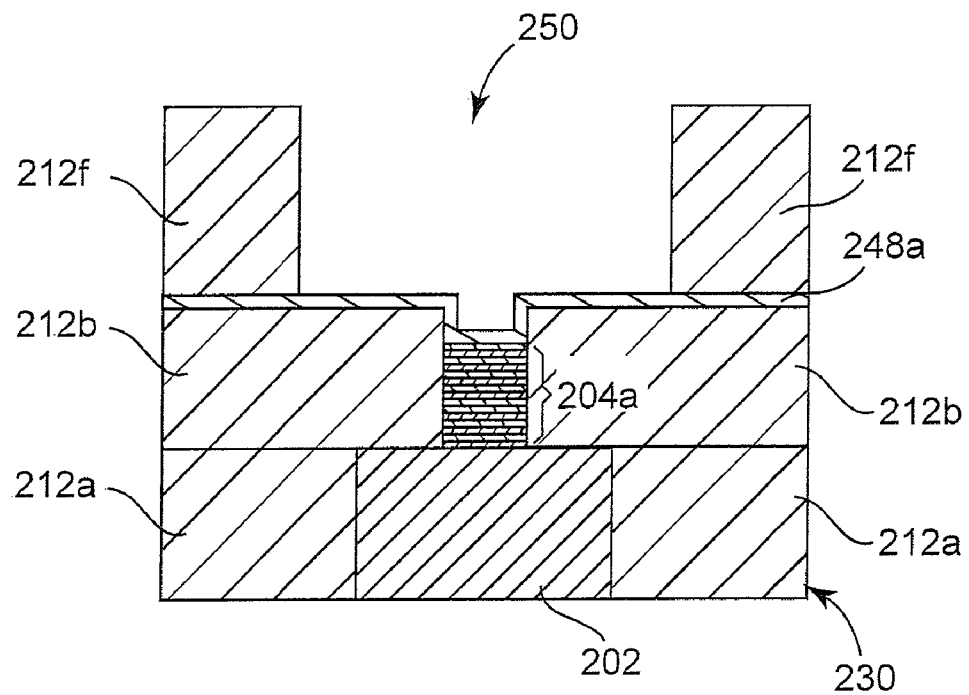
FIG. 20 illustrates a cross-sectional view of one embodiment of the preprocessed wafer, the bottom electrode, the first dielectric material layer, the etch stop material layer, and the second dielectric material layer after etching the second dielectric material layer.
Figure 21:
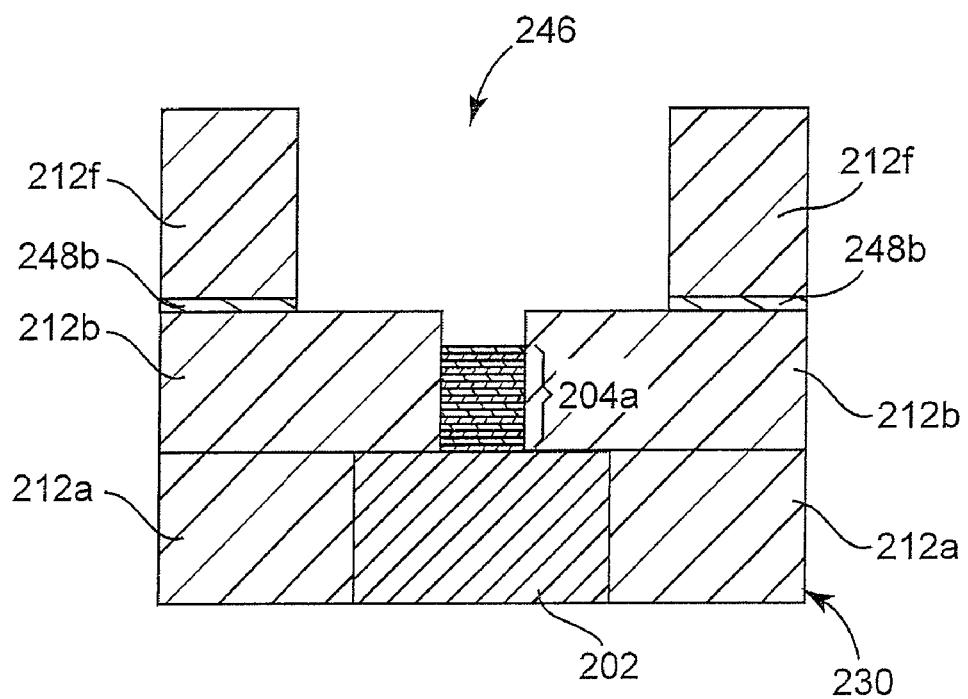
FIG. 21 illustrates a cross-sectional view of one embodiment of the preprocessed wafer, the bottom electrode, the first dielectric material layer, the etch stop material layer, and the second dielectric material layer after etching the etch stop material layer.

The following FIGS. 19-21 illustrate another embodiment for fabricating opening 246 previously described and illustrated with reference to FIG. 18.

FIG. 19 illustrates a cross-sectional view of one embodiment of preprocessed wafer 230, bottom electrode 204a, first dielectric material layer 212b, an etch stop material layer 248a, and a second dielectric material layer 212e. An etch stop material layer different than first dielectric material layer 212b, such as SiN or other suitable etch stop material is conformally deposited over first dielectric material layer 212b and bottom electrode 204a illustrated in FIG. 14E to provide etch stop material layer 248a. Etch stop material layer 248a is deposited using CVD, HDP-CVD, ALD, MOCVD, PVD, JVD, or other suitable deposition technique.

A dielectric material different than etch stop material layer 248a, such as SiO$_2$, SiO$_x$, SiN, FSG, BPSG, BSG, or other suitable dielectric material is deposited over etch stop material layer 248a to provide a second dielectric material layer. The second dielectric material layer is deposited using CVD, HDP-CVD, ALD, MOCVD, PVD, JVD, or other suitable deposition technique. The second dielectric material layer is then planarized to provide second dielectric material layer 212e. The second dielectric material layer is planarized using CMP or another suitable planarization technique.

FIG. 20 illustrates a cross-sectional view of one embodiment of preprocessed wafer 230, bottom electrode 204a, first dielectric material layer 212b, etch stop material layer 248a, and second dielectric material layer 212f after etching second dielectric material layer 212e. Second dielectric material layer 212e is etched to provide opening 250 exposing portions of etch stop material layer 248a.

FIG. 21 illustrates a cross-sectional view of one embodiment of preprocessed wafer 230, bottom electrode 204a, first dielectric material layer 212b, etch stop material layer 248b, and second dielectric material layer 212f after etching etch stop material layer 248a. Exposed portions of etch stop material layer 248a are etched to provide opening 246 exposing bottom electrode 204a and portions of first dielectric material layer 212b.

Figure 22:
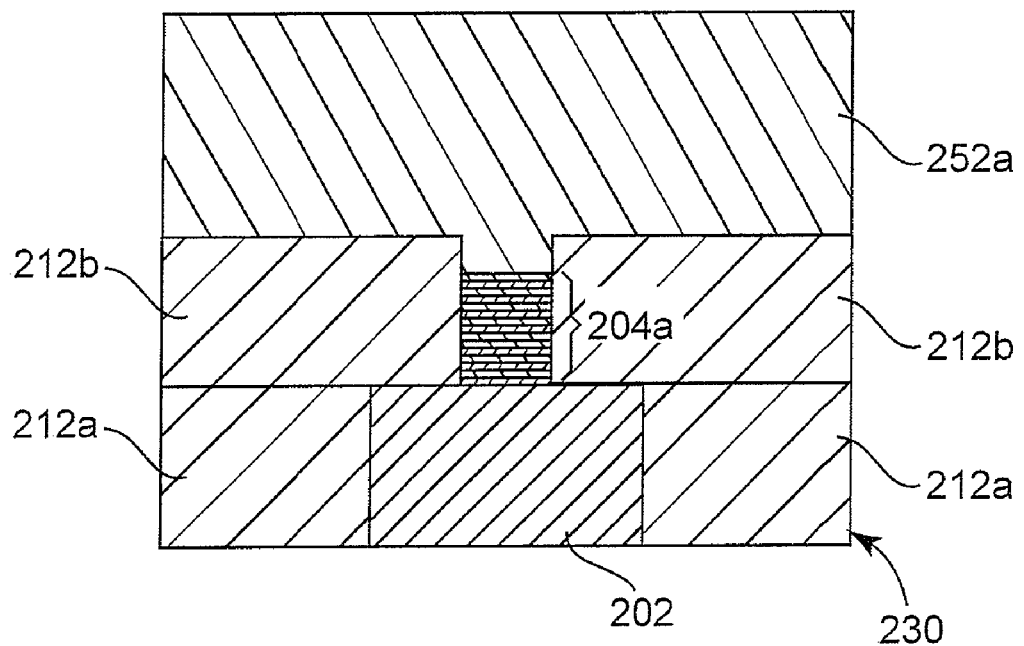
FIG. 22 illustrates a cross-sectional view of one embodiment of the preprocessed wafer, the bottom electrode, the first dielectric material layer, and a sacrificial material layer.
Figure 23:
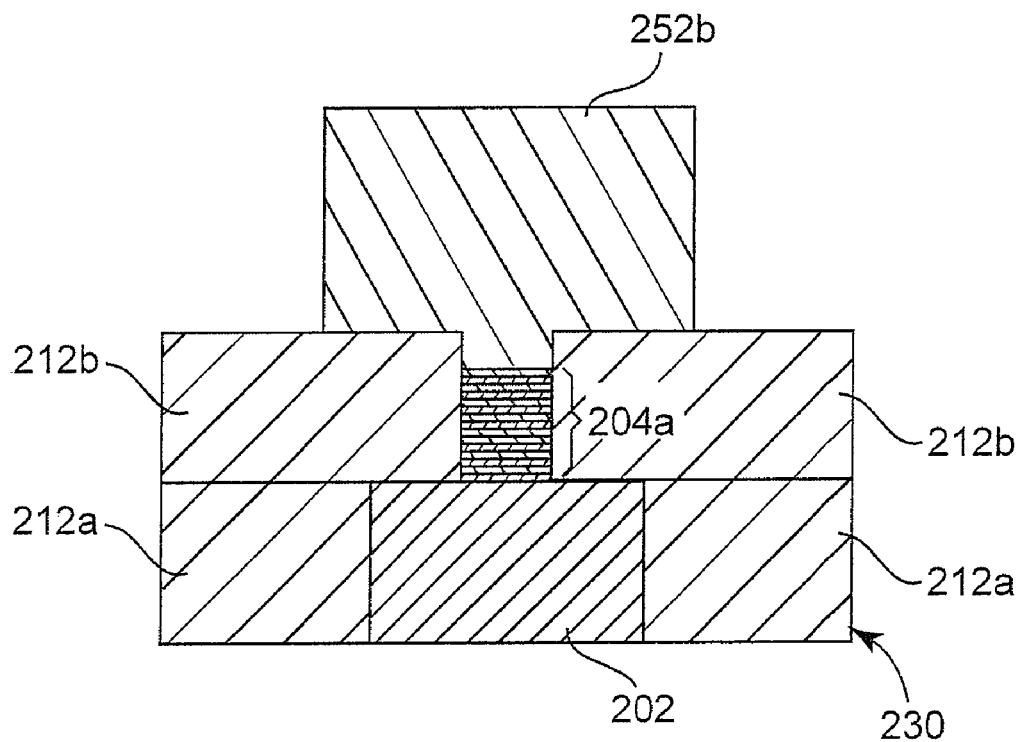
FIG. 23 illustrates a cross-sectional view of one embodiment of the preprocessed wafer, the bottom electrode, the first dielectric material layer, and the sacrificial material layer after etching the sacrificial material layer.
Figure 24:
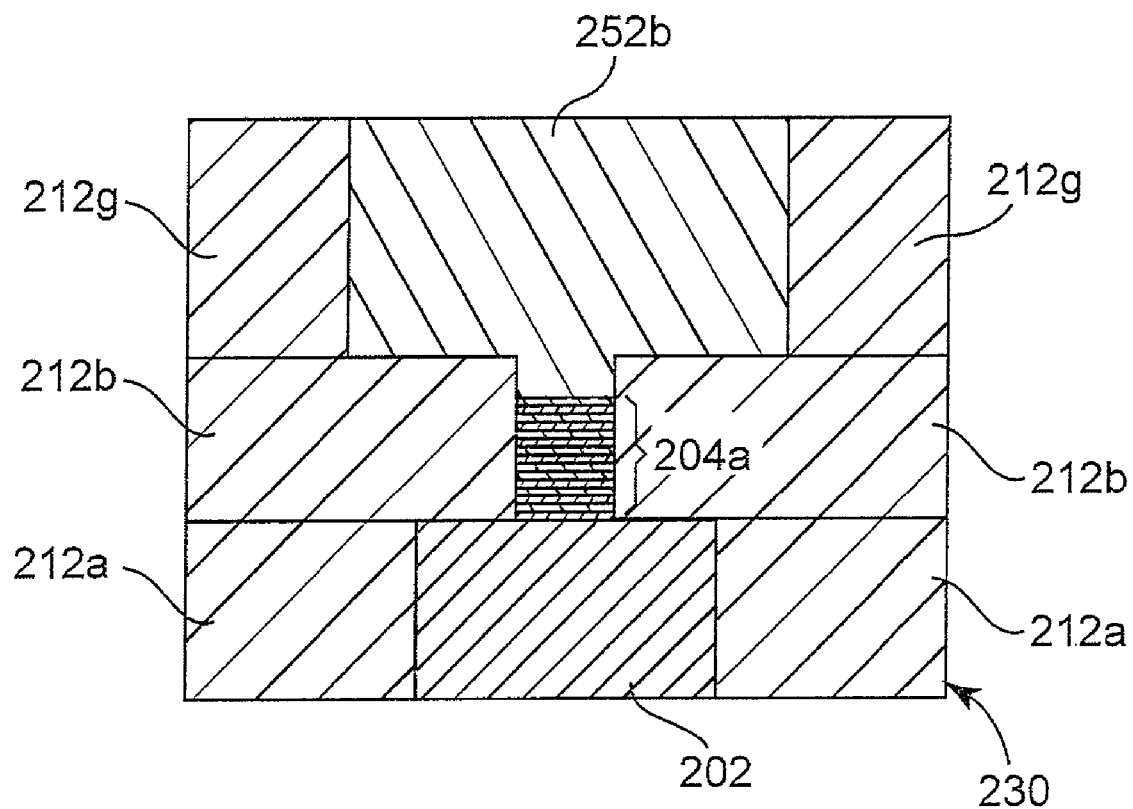
FIG. 24 illustrates a cross-sectional view of one embodiment of the preprocessed wafer, the bottom electrode, the first dielectric material layer, the sacrificial material layer, and a second dielectric material layer.

The following FIGS. 22-24 illustrate another embodiment for fabricating opening 246 previously described and illustrated with reference to FIG. 18.

FIG. 22 illustrates a cross-sectional view of one embodiment of preprocessed wafer 230, bottom electrode 204a, first dielectric material layer 212b, and a sacrificial material layer 252a. A sacrificial material, such as Si, C, or other suitable sacrificial material is deposited over first dielectric material layer 212b and bottom electrode 204a illustrated in FIG. 14E to provide a sacrificial material layer. The sacrificial material layer is deposited using CVD, HDP-CVD, ALD, MOCVD, PVD, JVD, or other suitable deposition technique. The sacrificial material layer is then planarized to provide sacrificial material layer 252a. The sacrificial material layer is planarized using CMP or another suitable planarization technique.

FIG. 23 illustrates a cross-sectional view of one embodiment of preprocessed wafer 230, bottom electrode 204a, first dielectric material layer 212b, and sacrificial material layer 252b after etching sacrificial material layer 252a. Sacrificial material layer 252a is etched to expose portions of first dielectric material layer 212b and to provide sacrificial material layer 252b. In one embodiment, sacrificial material layer 252b includes an island of sacrificial material over a single bottom electrode 204a. In another embodiment, sacrificial material layer 252b includes a line of sacrificial material over two or more bottom electrodes 204a in a row or column of memory array 101. In one embodiment, sacrificial material layer 252b is substantially centered over bottom electrode 204a.

FIG. 24 illustrates a cross-sectional view of one embodiment of preprocessed wafer 230, bottom electrode 204a, first dielectric material layer 212b, sacrificial material layer 252b, and a second dielectric material layer 212g. A dielectric material, such as SiO$_2$, SiO$_x$, SiN, FSG, BPSG, BSG, or other suitable dielectric material is deposited over exposed portions of sacrificial material layer 252b and first dielectric material layer 212b to provide a second dielectric material layer. The second dielectric material layer is deposited using CVD, HDP-CVD, ALD, MOCVD, PVD, JVD, or other suitable deposition technique. The second dielectric material layer is then planarized to expose sacrificial material layer 252b and to provide second dielectric material layer 212g. The second dielectric material layer is planarized using CMP or another suitable planarization technique. Sacrificial material layer 252b is then removed to provide opening 246 exposing bottom electrode 204a and portions of first dielectric material layer 212b as previously described and illustrated with reference to FIG. 18.

Figure 25:
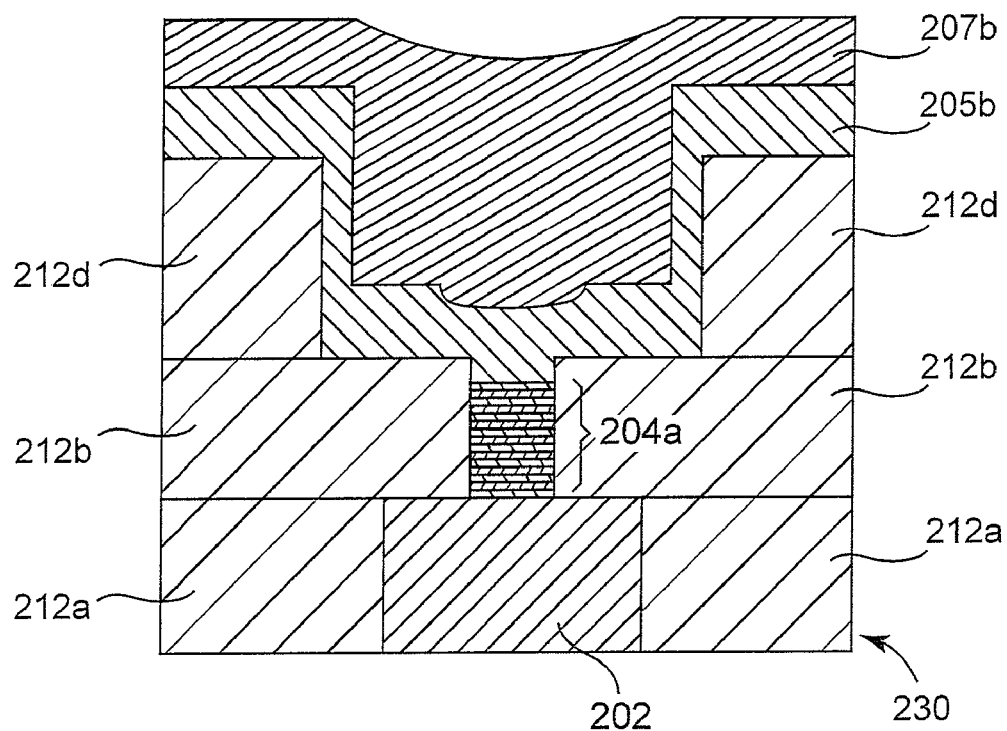
FIG. 25 illustrates a cross-sectional view of one embodiment of the preprocessed wafer, the bottom electrode, the first dielectric material layer, the second dielectric material layer, a phase change material layer, and an electrode material layer.

FIG. 25 illustrates a cross-sectional view of one embodiment of preprocessed wafer 230, bottom electrode 204a, first dielectric material layer 212b, second dielectric material layer 212d, a phase change material layer 205b, and an electrode material layer 207b. A phase change material, such as a chalcogenide compound material or other suitable phase change material is conformally deposited over exposed portions of second dielectric material layer 212d, first dielectric material layer 212b, and bottom electrode 204a illustrated in FIG. 18 to provide phase change material layer 205b. Phase change material layer 205b is deposited using CVD, HDP-CVD, ALD, MOCVD, PVD, JVD, or other suitable deposition technique.

An electrode material, such as TiN, TaN, W, Al, Ti, Ta, TiSiN, TaSiN, TiAlN, TaAlN, Cu, WN, C, or other suitable electrode material is deposited over phase change material layer 205b to provide electrode material layer 207b. Electrode material layer 207b is deposited using CVD, HDP-CVD, ALD, MOCVD, PVD, JVD, or other suitable deposition technique.

Figure 26:
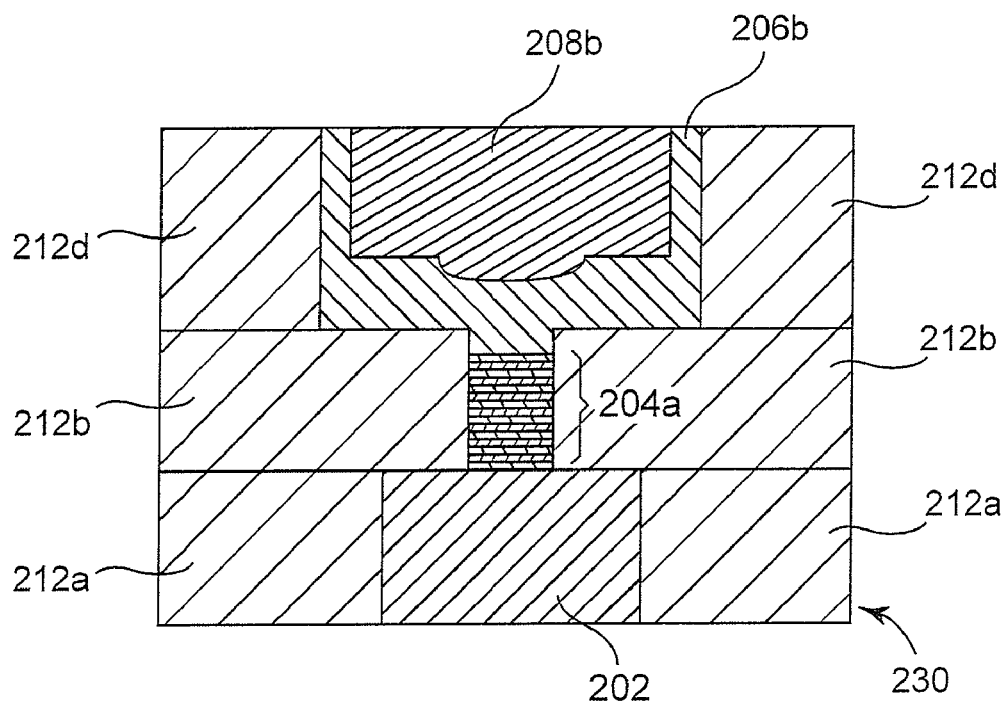
FIG. 26 illustrates a cross-sectional view of one embodiment of the preprocessed wafer, the bottom electrode, the first dielectric material layer, the second dielectric material layer, a phase change material storage location, and a top electrode after planarizing the electrode material layer and the phase change material layer.

FIG. 26 illustrates a cross-sectional view of one embodiment of preprocessed wafer 230, bottom electrode 204a, first dielectric material layer 212b, second dielectric material layer 212d, a phase change material storage location 206b, and a top electrode 208b after planarizing electrode material layer 207b and phase change material layer 205b. Electrode material layer 207b and phase change material layer 205b are planarized to expose second dielectric material layer 212d and to provide top electrode 208b and phase change material storage location 206b. Top contact 210 is then formed over top electrode 208b using additional deposition and etching processes to provide phase change element 200c or 200d as previously described and illustrated with reference to FIGS. 4A and 4B.

Figure 27:
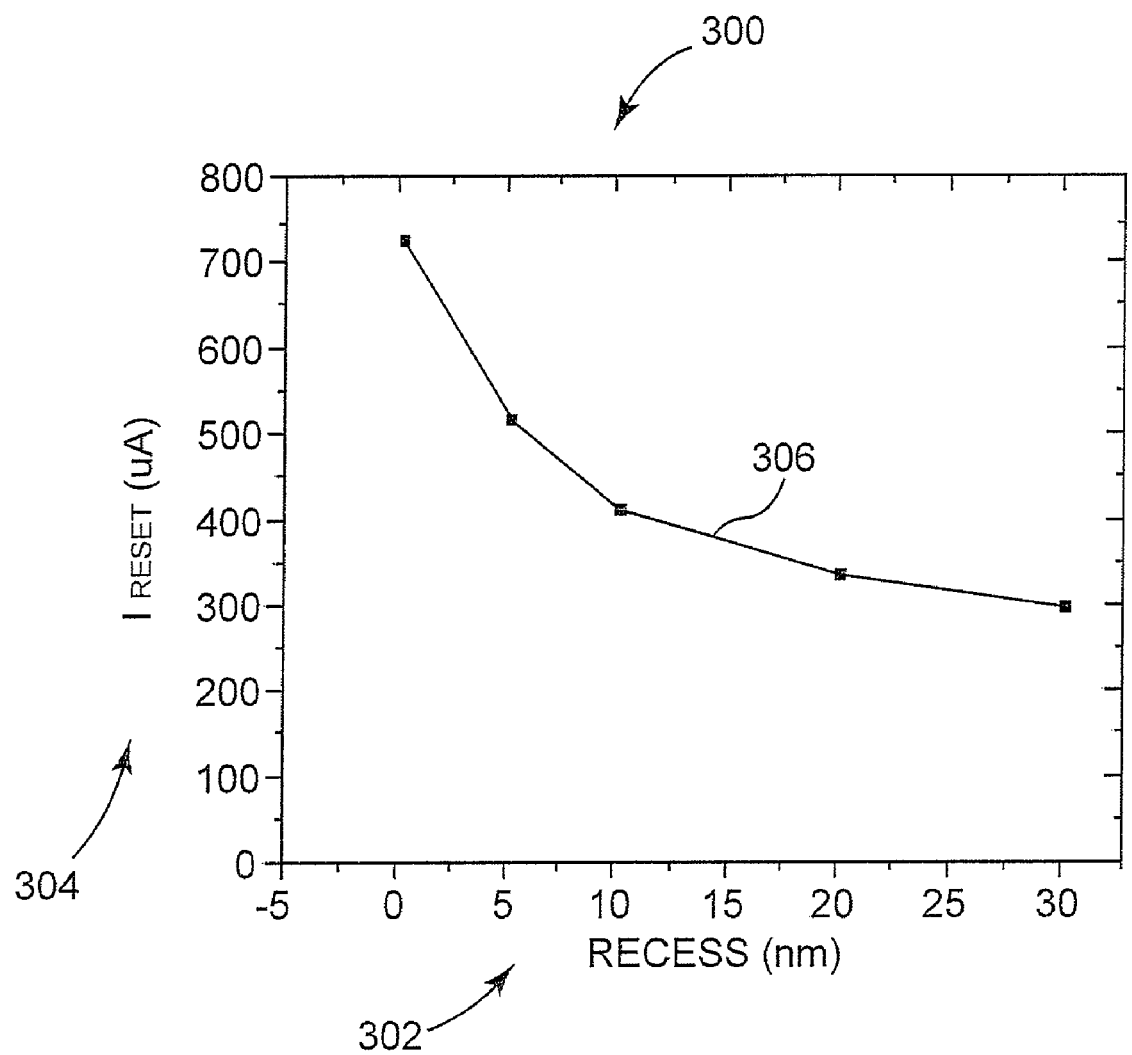
FIG. 27 is a graph illustrating one embodiment of reset current versus recess depth of the phase change material in a mushroom memory cell.

FIG. 27 is a graph 300 illustrating one embodiment of reset current versus recess depth of the phase change material in a mushroom memory cell. Graph 300 includes recess depth in nanometers (nm) on x-axis 302 and reset current ($I_{RESET}$) in micro amps (µA) on y-axis 304. As indicated by curve 306, as the recess depth increases, the reset current decreases. A desired reset current is therefore selected by controlling the number of electrode material layers of the bottom electrode that are selectively etched. By selectively etching the multiple electrode material layers, the recess depth can be precisely and consistently controlled for all memory cells within the memory array.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a first electrode including at least two electrode material layers;
   a resistivity changing material including a first portion and a second portion, the first portion contacting the first electrode and having a same cross-sectional width as the first electrode, the second portion having a greater cross-sectional width than the first portion; and
   a second electrode coupled to the resistivity changing material.

2. The integrated circuit of claim 1, wherein the resistivity changing material includes a third portion laterally surrounding the second electrode.

3. The integrated circuit of claim 1, wherein the first electrode comprises a first portion and a second portion, the first portion having a greater cross-sectional width than the second portion.

4. The integrated circuit of claim 3, wherein the first portion of the first electrode is spacer defined.

5. The integrated circuit of claim 1, wherein the first electrode includes a first electrode material layer comprising one of TiN, TaN, W, Al, Ti, Ta, TiSiN, TaSiN, TiAlN, TaAlN, Cu, WN, Si, Ge, and phase change material and a second electrode material layer comprising one of TiN, TaN, W, Al, Ti, Ta, TiSiN, TaSiN, TiAlN, TaAlN, Cu, WN, and C.

6. The integrated circuit of claim 1, wherein the first electrode has a sublithographic cross-sectional width.

7. The integrated circuit of claim 1, wherein the resistivity changing material comprises a phase change material.

8. The integrated circuit of claim 1, wherein the first electrode includes more than two electrode material layers.

9. A system comprising:
   a host; and
   a memory device communicatively coupled to the host, the memory device comprising:
      a first electrode including multiple electrode material layers;
      a phase change material including a first portion and a second portion, the first portion contacting the first electrode and having a same cross-sectional width as the first electrode, the second portion having a greater cross-sectional width than the first portion; and
      a second electrode coupled to the phase change material.

10. The system of claim 9, wherein the phase change material includes a third portion laterally surrounding the second electrode.

11. The system of claim 9, wherein the first electrode comprises a first portion and a second portion, the first portion having a greater cross-sectional width than the second portion.

12. The system of claim 9, wherein the first electrode includes a first electrode material layer comprising one of TiN, TaN, W, Al, Ti, Ta, TiSiN, TaSiN, TiAlN, TaAlN, Cu, WN, Si, Ge, and phase change material and a second electrode material layer comprising one of TiN, TaN, W, Al, Ti, Ta, TiSiN, TaSiN, TiAlN, TaAlN, Cu, WN, and C.

13. The system of claim 9, wherein the first electrode has a sublithographic cross-sectional width.

14. The system of claim 9, wherein the memory device further comprises:
   a write circuit configured to write data to the phase change material;
   a sense circuit configured to read data from the phase change material; and
   a controller configured to control the write circuit and the sense circuit.

* * * * *